(12) United States Patent
Winstead et al.

(10) Patent No.: US 8,390,026 B2
(45) Date of Patent: Mar. 5, 2013

(54) ELECTRONIC DEVICE INCLUDING A HETEROJUNCTION REGION

(75) Inventors: Brian A. Winstead, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1572 days.

(21) Appl. No.: 11/559,642

(22) Filed: Nov. 14, 2006

(65) Prior Publication Data
US 2008/0111153 A1    May 15, 2008

(51) Int. Cl.
*H01L 29/78* (2006.01)
*H01L 21/04* (2006.01)

(52) U.S. Cl. ........ 257/190; 257/192; 257/347; 257/350; 257/351; 257/352; 257/353; 257/354; 257/618; 257/E21.703; 257/E29.255; 438/585

(58) Field of Classification Search ............. 257/190, 257/192, 347, 350–354, 618, 623, E21.04, 257/E21.703, E27.112, E29.056, E29.16, 257/E29.255, E29.298; 438/585
See application file for complete search history.

(56) References Cited

U.S. PATENT DOCUMENTS

| | | | |
|---|---|---|---|
| 6,339,232 B1 | 1/2002 | Takagi | |
| 6,580,104 B1 | 6/2003 | U'Ren | |
| 6,797,553 B2 | 9/2004 | Adkisson et al. | |
| 7,098,516 B2 | 8/2006 | Colombo et al. | |
| 7,226,826 B2 | 6/2007 | Alshareef et al. | |
| 7,229,873 B2 | 6/2007 | Colombo et al. | |
| 7,393,733 B2 | 7/2008 | Currie | |
| 7,429,776 B2 | 9/2008 | Koyama et al. | |
| 2002/0014662 A1* | 2/2002 | Yamazaki et al. | 257/347 |
| 2003/0235082 A1 | 12/2003 | Hsu et al. | |
| 2005/0082531 A1* | 4/2005 | Rim | 257/72 |
| 2005/0136677 A1 | 6/2005 | Brask et al. | |
| 2005/0230781 A1 | 10/2005 | Ema et al. | |
| 2005/0274978 A1 | 12/2005 | Antoniadis et al. | |
| 2006/0071285 A1 | 4/2006 | Datta et al. | |
| 2006/0226453 A1 | 10/2006 | Wang et al. | |
| 2006/0267895 A1 | 11/2006 | Yanase | |
| 2007/0132033 A1 | 6/2007 | Wu et al. | |
| 2007/0252216 A1 | 11/2007 | Muhammad | |

OTHER PUBLICATIONS

Wang et al., "Low Power Device Technology with SiGe Channel, HfSiON, and Poly-Si Gate," 2004 IEEE, 0-7803-8684-1, IEDM 04, pp. 161-164.

Lander et al., "High Hole Mobilities in Fully-Strained Si(1-x)Ge(x) Layers (0.3<x<0.4) and their Significance for SiGe pMOSFET Performance," IEEE Transactions on Electron Devices, vol. 48, No. 8, Aug. 2001, pp. 1826-1832.

Krishnamohan et al., "High-Mobility Low Band-to-Band-Tunneling Strained-Germanium Double-Gate Heterostructure FETs: Simulations," IEE Transactions of Electron Devices, vol. 53, No. 5, May 2006, pp. 1000-1009.

(Continued)

Primary Examiner — Hrayr A Sayadian

(57) ABSTRACT

An electronic device can include a first transistor having a first channel region further including a heterojunction region that, in one aspect, is at most approximately 5 nm thick. In another aspect, the first transistor can include a p-channel transistor including a gate electrode having a work function mismatched with the associated channel region, and the heterojunction region can lie along a surface of a semiconductor layer closer to a substrate than an opposing surface of the substrate. The electronic device can also include an n-channel transistor, and the subthreshold carrier depth of the p-channel and n-channel transistors can have approximately a same value as compared to each other. A process of forming the electronic device can include forming a compound semiconductor layer having an energy band gap greater than approximately 1.2 eV.

20 Claims, 3 Drawing Sheets

OTHER PUBLICATIONS

Weber et al., "Fabrication and Mobility Characteristics of SiGe Surface Channel pMOSFETs with a HfO2/TiN Gate Stack," IEEE Transactions on Electron Devices, vol. 53, No. 3, Mar. 2006, pp. 449-456.
Bera et al., "A Dual-Strained CMOS Structure THrough Simultaneous Formation of Relaxed and Compressive Strained-SiGe-on-Insulatior," IEEE Electron Device Letters, vol. 27, No. 5, May 2006, pp. 350-353.
Non-Final Office Action for U.S. Appl. No. 11/559,633.
Non-Final Office Action for U.S. Appl. No. 11/559,633, Nov. 5, 2009.
Final Office Action for U.S. Appl. No. 11/559,633.
Semiconductor Physics and Devices Basic Principles; Donald A. Neamen; Second Edition; The McGraw-Hill Companies, Inc 1992 and 1997 pp. 308-309.
Final Office Action for U.S. Appl. No. 11/559,633, May 14, 2009.
Semiconductor Physics and Devices Basic Principles; Donald A. Newmen; Second Edition; The McGraw-Hill Companies, Inc. 1992 and 1997; 4 pages.

* cited by examiner

ELECTRONIC DEVICE INCLUDING A HETEROJUNCTION REGION

RELATED APPLICATION

The present disclosure relates to United States patent application Ser. No. 11/559,633, entitled "Electronic Device Including a Transistor Having a Metal Gate Electrode and a Process for Forming the Electronic Device" by Capasso, et. al. filed on Nov. 14, 2006, which is assigned to the current assignee hereof and incorporated by reference in its entirety.

BACKGROUND

1. Field of the Disclosure

The present disclosure relates to electronic devices, more particularly, to electronic devices that have heterojunction regions and process for forming them.

2. Description of the Related Art

Attempting to form improved versions of both a p-channel ("PMOS") component and an n-channel ("NMOS") component in a single electronic device ("complimentary metal-oxide-semiconductor" or "CMOS") can be far more difficult and costly than improving either component alone. Individual component performance can be improved by selection and engineering of channel materials, electrode work functions, gate materials, implant doses, and the like. However, in general, improvement in performance for one type of transistor tends to degrade the performance of the other type of transistor. Thus, substantially any over all improvement in CMOS performance tends to require inclusion of the separate improvements of both the PMOS and NMOS components.

For example, a substrate surface, as obtained from a commercially-available source, normally supports one transistor type. In order to form both a p-channel transistor and an n-channel transistor along the substrate surface, a second region of the substrate that supports the other transistor type can be formed adding expense to the process. One method is to remove and replace portions of the substrate, or if the substrate is a silicon-on-insulator substrate, expose a portion of the base layer. Still another method is to deposit a SiGe layer that is over a micron thick over the substrate. However, such methods require long processes be used that are both time consuming and expensive to perform. Long etch processes can be required to avoid the n-channel transistor and the p-channel transistor being formed at substantially different elevations, which adds complexity to both imaging and planarization processing during manufacturing.

Another challenge is reducing the switching time so an electronic component can be used in a higher performance electronic device. One attempt is to match the work function of the gate electrode with the appropriate energy band for the channel region to lower the threshold voltage ("Vth") of the electronic component. For example, a high performance n-channel transistor has a gate electrode work function closer to the conduction band than the valence band of the n-channel region, and a high performance p-channel transistor has a work function closer to the valence band than the conduction band of the p-channel region. However, this requires that a gate electrode with the appropriate work function be formed for each of the channel region types.

In an attempt to reduce manufacturing costs, a single gate electrode can be used, however either the n-channel transistor, the p-channel transistor, or the combination thereof will have a worse mismatch and therefore a higher Vth than the case with two different gate electrode work functions. In a further attempt to use a single gate electrode process, one or both of the channel regions can be lightly doped or counter doped. However, the centroid of the distribution of subthreshold carriers within a lightly doped or counter doped channel can be farther from the channel surface leading to an increase in undesirable buried channel effects.

Another attempt to improve performance is to move the source and drain regions closer to each other. However, electrical field effects from a drain region, such as drain induced barrier lowering, affect a portion of the channel region adjacent to the drain and scale with the operating voltage rather than physical dimension. Thus, unless the operating voltage is scaled down as the channel region is scaled down, such a portion accounts for a higher percentage of the total channel region and the leakage increases accordingly.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
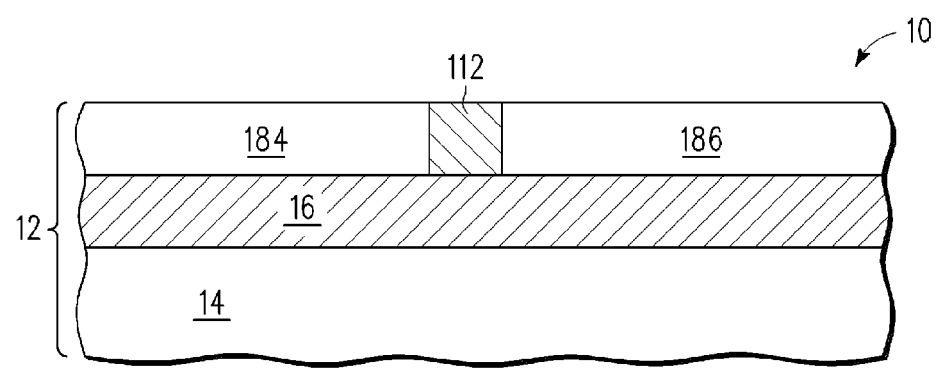
FIG. 1 includes an illustration of a cross-sectional view of a substrate including an isolation region between a first active region and a second active region of a semiconductor layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a heterojunction region. In a first aspect, an electronic device can include a first transistor including a first channel region. The first channel region can include a heterojunction region overlying a semiconductor substrate, and the heterojunction region can be at most approximately 5 nm thick.

In a second aspect, an electronic device can include an n-channel transistor including a first channel region having a first subthreshold carrier depth, and a first gate electrode having a first work function matched with the first channel region. The electronic device can also include a p-channel transistor including a second channel region having a second subthreshold carrier depth, and a second gate electrode having a second work function mismatched with the second channel region. The electronic device can further include a semiconductor layer lying between the second gate electrode and a semiconductor substrate, wherein, the semiconductor layer has a first surface and a second surface opposite the first surface, and the first surface lies closer to the semiconductor substrate than the second surface. A heterojunction region can lie along the first surface of the semiconductor layer, a thickness of the semiconductor layer can have approximately a same value as the first subthreshold carrier depth, and the first subthreshold carrier depth has approximately a same value as the second subthreshold carrier depth.

In a third aspect, a process of forming an electronic device can include forming a first semiconductor layer over a semiconductor substrate, wherein the semiconductor substrate has a first conductivity type. The first semiconductor layer can have a second conductivity type, and the first semiconductor layer is at most approximately 5 nm in thickness. The first semiconductor layer can have a first surface and a second surface opposite the first surface, wherein the first surface lies closer to the semiconductor substrate than the second surface. A heterojunction region can lie along the first surface of the first semiconductor layer. The process can further include forming a gate structure over the first semiconductor layer, wherein the gate structure is associated with a channel region, and the heterojunction region substantially lies within the channel region.

In accordance with the present disclosure, an electronic device is formed having a transistor having a channel region, the channel region further including a heterojunction region that is at most approximately 5 nm thick. In accordance with a specific embodiment, the heterojuction region within the channel region can affect the subthreshold carrier distribution within the channel region. As a result, a transistor with a gate electrode having a work function mismatched with the channel region can have reduced leakage current due to substantially changing the effective depth at which charges flow when the component would be used as compared to when the heterojunction region is not present. By forming the heterojunction region within the channel region, a short channel length n-channel transistor or p-channel transistor can be fabricated using a single gate formation process. Specific embodiments of the present disclosure will be better understood with reference to FIGS. 1 through 7.

Some terms are defined or clarified as to their intended meaning as they are used within this specification.

The term "heterojunction region" is intended to mean a portion of a channel region of a transistor lying between a gate electrode of the transistor and a heterojunction of two dissimilar semiconductor compositions within the channel region.

The term "minority carrier" refers to a hole for a p-channel transistor and an electron for an n-channel transistor.

The term "match" when used in association with a gate electrode and a channel region of a same transistor is intended to describe a relationship between the work function of the gate electrode and an energy band of a semiconductor material within the channel region. The gate electrode matches with the channel region when the work function of the gate electrode is closer to the energy band at which minority carriers flow within the channel region than the energy level of the opposite edge of an energy band gap of the semiconductor material. For example, a gate electrode having a work function closer to the valence band than the conduction band is matched with a channel region of a p-channel transistor. A gate electrode not matched with a channel region of a same transistor is "mismatched" with the channel region.

The term "metal" or any of its variants is intended to refer to a material that includes an element that is within any of the Groups 1 to 12, within Groups 13 to 16, an element that is along and left of a line defined by atomic numbers 13 (Al), 31 (Ga), 50 (Sn), 51 (Sb), and 84 (Po). Metal does not include Si or Ge.

The term "metal gate electrode" is intended to mean a gate electrode including a metal that substantially sets the work function for the gate electrode. A metal gate electrode may or may not include silicon, germanium, or any combination thereof.

The term "semiconductor substrate" is intended to mean either a semiconductor base material or a base material with an overlying semiconductor layer. A semiconductor substrate can include a buried oxide layer. Examples of semiconductor substrates include bulk silicon wafers, silicon on insulator wafers, or the like.

The term "subthreshold carrier depth", with respect to a transistor, is intended to mean the depth of the centroid of the subthreshold carrier distribution before reaching the threshold voltage of the transistor.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 includes a cross-sectional view of an illustration of a portion of a workpiece 10 including a portion of a semiconductor substrate 12 including an isolation region 112. In the illustrated embodiment, semiconductor substrate 12 is a semiconductor-on-insulator ("SOI") substrate that includes a base layer 14, an insulating layer 16, and a semiconductor layer 18. The semiconductor layer 18 can include an active region 184 and an active region 186 lying adjacent to the isolation region 112. In the illustrated embodiment, base layer 14 includes a support layer and provides mechanical support for the other layers of the substrate 12. The base layer 14 can include substantially any material physically strong enough to support the substrate 12 and compatible with the subsequent processing. In a particular embodiment, the base layer 14 includes a semiconductor material.

The insulating layer 16 can be a buried insulating layer and provide electrical insulation between the base layer 14 and the semiconductor layer 18. The insulating layer 16 includes an oxide, a nitride, an oxynitride, or any combination thereof. The semiconductor layer 18 includes a semiconductor element such as silicon, germanium, carbon, or any combination thereof, and has a substantially uniform thickness in a range of approximately 50 to approximately 150 nm. In one embodiment, the semiconductor layer 18 includes an n-type active semiconductor region, a p-type active semiconductor region, or any combination thereof. In the illustrated embodiment, the active region 184 and the active region 186 can include a same or different dopant-type. The isolation region 112 lies between the active region 184 and the active region 186, and provide electrical isolation between the regions. The isolation region 112 includes an oxide, a nitride, an oxynitride, or any combination thereof and can be grown or deposited using a conventional or proprietary process.

Figure 2:
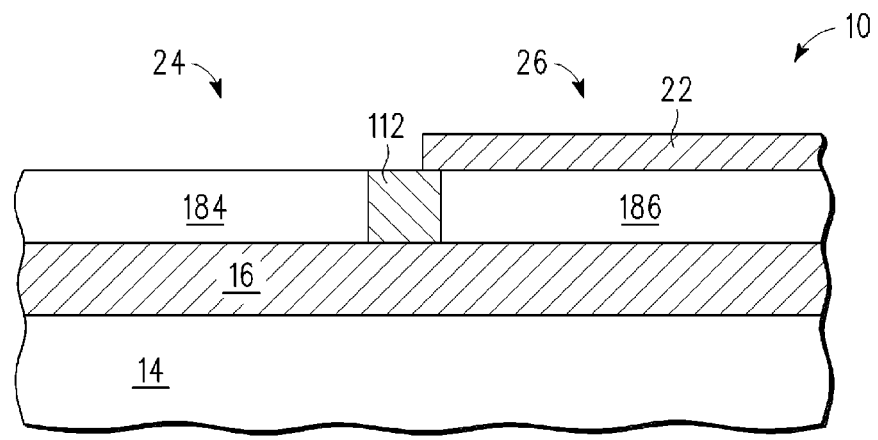
FIG. 2 includes an illustration of a cross-sectional view of the workpiece of FIG. 1 after forming protective layer over a portion of the substrate.

FIG. 2 includes an illustration of a cross-sectional view of the workpiece 10 after forming a protective layer 22 over the active region 186 at a location 26. In one embodiment, the active region 184 remains exposed at a location 24. The protective layer 22 serves as a hard mask to protect the active region 186 during subsequent processing. The material of the protective layer 22 is typically selected such that a process designed to react at the surface of the active region 184 will substantially not react at the surface of the protective layer 22. In another embodiment, the protective layer 22 serves as an etch-stop layer such that a subsequently deposited layer can be removed from the location 26 without exposing the active region 186. The protective layer 22 includes an oxide, a nitride, an oxynitride, another material resistant to appropriate processing conditions, or any combination thereof. The protective layer 22 has a thickness in a range of approximately 10 nm to approximately 100 nm and is grown or deposited using a conventional or proprietary process.

Figure 3:
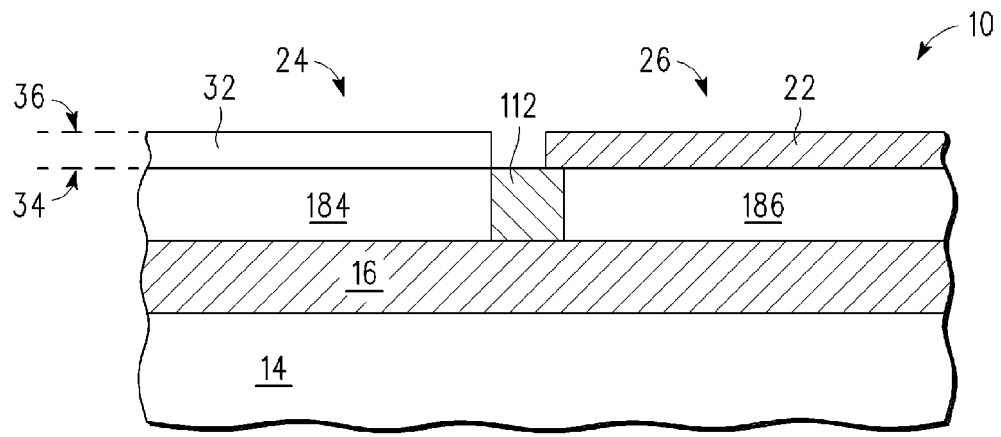
FIG. 3 includes an illustration of a cross-sectional view of the workpiece of FIG. 2 after selectively after forming a semiconductor layer over an exposed portion of the substrate.

FIG. 3 includes an illustration of a cross-sectional view of the workpiece 10 after forming a semiconductor layer 32 over the active region 184. The semiconductor layer 32 includes a first surface 34 and a second surface 36 opposite the first surface 34. The first surface 34 lies closer to the semiconductor substrate 12 than the second surface 36. In one embodiment, the semiconductor layer 32 and the active region 184 each include a different semiconductor material and form a heterojunction region within the semiconductor layer 32. In a particular embodiment, the heterojunction region lies along the first surface 34. The semiconductor layer 32 can be deposited using a conventional or proprietary process. In one embodiment, the semiconductor layer 32 is formed by epitaxial growth. Although not illustrated, in another embodiment, the semiconductor layer 32 is blanket deposited and a portion overlying the protective layer 22 can be removed.

In one embodiment, the semiconductor layer 32 includes a dopant. The semiconductor layer 32 can be doped during the formation process. By distributing the dopant during the deposition process, the dopant profile of a subsequently formed channel region can be substantially confined within the semiconductor layer 32. In another embodiment the semiconductor layer 32 can be doped subsequent to the completion of the deposition of the semiconductor layer 32.

In one embodiment, the semiconductor layer 32 is a SiGe alloy. In a particular embodiment, semiconductor layer 32 has a germanium concentration of at most approximately 45 atomic percent germanium. In a more particular embodiment, the semiconductor layer 32 has a germanium concentration in a range of approximately 20 to approximately 30 atomic percent. The semiconductor layer 32 can have a lattice constant different then the lattice constant of the active region 184 at a same temperature, such as 0 degrees centigrade. In a more particular embodiment, the semiconductor layer 32 has a compressive stress. In one embodiment, the semiconductor layer 32 includes a different dopant type from the active region 186. In another embodiment, the semiconductor layer 32 has a same dopant type as another layer immediately adjacent to the first surface 34. In still another embodiment, the semiconductor layer 32 has a same doping type as the active region 184. In one embodiment, the semiconductor layer 32 has a dopant concentration in a range of 1 E16 to 2 E19 atoms per cubic centimeter. In a particular embodiment the semiconductor layer 32 includes boron at a concentration of approximately 1 E19 atoms per cubic centimeter. The thickness of the semiconductor layer 32 is selected to approximately correspond to the amplitude of the carrier wave form within the subsequently formed channel region at operating conditions. Thus, the exact thickness of the semiconductor layer 32 varies depending on the carrier type, the channel material, the dopants present within the channel region, specified operating conditions, or any combination thereof. In one embodiment, the semiconductor layer 32 has a thickness of at most approximately 5 nm, and in a more particular embodiment, has a thickness in a range of approximately 3 to approximately 5 nm. The protective layer 22 can then be removed using a conventional or proprietary process to expose a portion of the active region 186 at the location 26.

Figure 4:
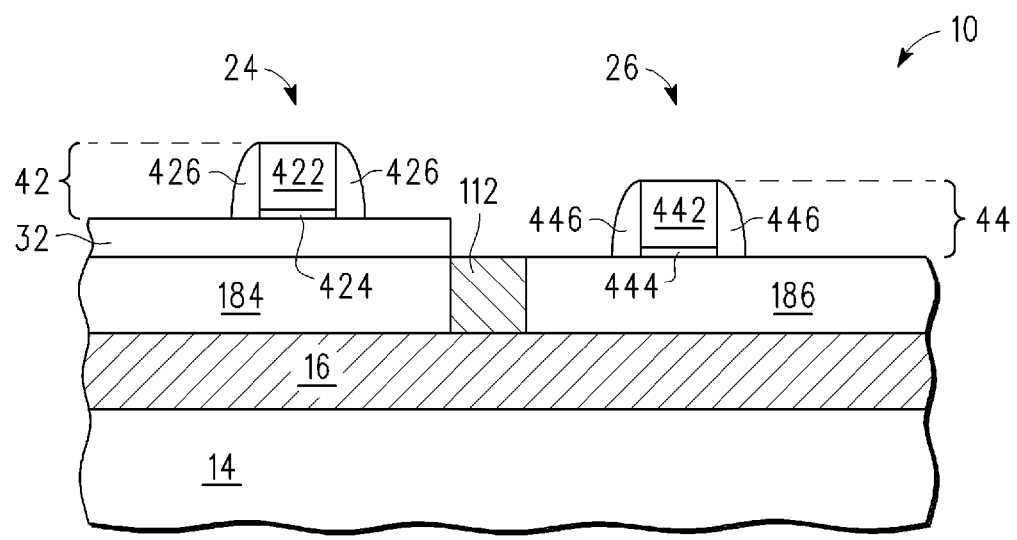
FIG. 4 includes an illustration of a cross-sectional view of the workpiece of FIG. 3 after forming a first transistor structure at a first location and a second transistor structure at a second location.

FIG. 4 includes an illustration of the workpiece 10 after forming a transistor structure 42 at the location 24 and the transistor structure 44 and the location 26. The transistor structure 42 includes a gate electrode 422, a gate dielectric 424, and a spacer structure 426. The transistor structure 44 includes a gate electrode 442, a gate dielectric 444, and a spacer structure 446.

In the illustrated embodiment, the gate dielectric 424 includes a dielectric material such as silicon dioxide, silicon nitride, silicon oxynitride, a high dielectric constant ("high-k") material (e.g., dielectric constant greater than 8), or any combination thereof. The high-k material includes $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1.

As illustrated, the gate dielectric 424 is thermally grown in an oxidizing or nitridizing ambient using a conventional or proprietary process. In another embodiment the gate dielectric 424 is deposited using a conventional or proprietary chemical vapor deposition ("CVD") technique, physical vapor deposition ("PVD") technique, atomic layer deposition ("ALD") technique, or any combination thereof. In such a case, additional processing, such as masking and etch steps, is used to remove portions of the gate dielectric 424 overlying the workpiece 10 at locations other than the location 24. The gate dielectric 424 can have a thickness in a range of approximately 1 to approximately 25 nm. The gate dielectric 444 at the location 26 can be formed by an embodiment described for the gate dielectric 424. As compared to each other, the gate dielectric 424 and the gate dielectric 444 can each have the same or different material composition, be formed at the same or different time, be formed using a same or different embodiment, have the same or different thickness, or any combination thereof.

The gate electrode 422 and the gate electrode 442 each have a work function that affects the subthreshold carrier depth in an associated channel region that can be subsequently formed. In one embodiment, the gate electrode 422 and the gate electrode 442 include a metal, and in a particular embodiment, include a metal gate electrode. In a more particular embodiment, the gate electrode 422 and the gate electrode 442 can include TaC, TiN, $Mo_2N$, or any combination thereof. The gate electrode 422, the gate electrode 442, or any combination thereof is deposited using a conventional or proprietary CVD process, PVD process, ALD process, or any combination thereof. As compared to each other, the gate electrode 422 and the gate electrode 442 can each have the same or different material composition, be formed at the same or different time, be formed using a same or different embodiment, have the same or different thickness, or any combination thereof.

In a particular embodiment, the gate electrode 422 and the gate electrode 442 each have a substantially a same work function value. In a more particular embodiment, the gate electrode 422 and the gate electrode 442 each include a same material. In an even more particular embodiment, the gate electrode 422 and the gate electrode 442 each include TaC.

Although not illustrated, dopant can be introduced to the substrate 12 adjacent to the gate electrode 422, the gate electrode 442, or any combination thereof using a conventional or proprietary process. Such an implant serves as a portion of a source region, a drain region, a source/drain region, or any combination thereof.

The spacer structure 426 can lie adjacent to the gate electrode 422 and over the active region 184 at the location 24. The spacer structure 426 includes material as previously described for the insulating layer 16. In one embodiment, an insulating layer (not illustrated) is formed over the gate electrode 422 using a conventional or proprietary CVD process, PVD process, ALD process, or any combination thereof. The insulating layer can be removed using a conventional or a proprietary etch process to form the spacer structure 426. In a particular embodiment, a portion of the spacer structure immediately adjacent to the gate electrode structure includes a nitride.

The spacer structure 446 lies adjacent to the gate electrode 442 and over the active region 186 at the location 26. The spacer structure 446 is formed using an embodiment described for the spacer structure 426. As compared to each other, the spacer structure 426 and the spacer structure 446 can each have the same or different material composition, be formed at the same or different time, be formed using a same or different process, have the same or different thickness, or any combination thereof.

Figure 5:
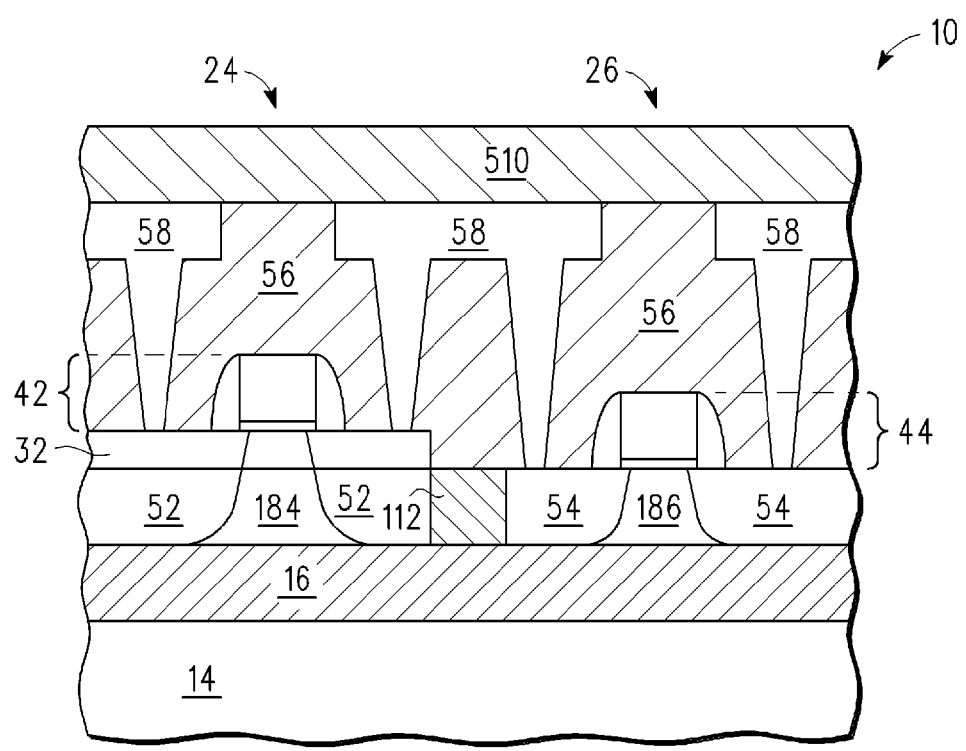
FIG. 5 includes an illustration of a substantially complete electronic device.

FIG. 5 includes an illustration of a cross-sectional view of a substantially completed electronic device. Doped regions 52 and doped regions 54 are formed using a conventional or proprietary process and serve as source regions, drain regions, source/drain regions, or any combination thereof for the electronic components at the location 24 and the location 26, respectively. One or more insulating layers 56, one or more interconnect levels 58, and one or more encapsulating layers 510 are formed using one or more conventional or proprietary techniques.

The electronic device includes a first transistor at the location 24, having a first channel region lying between the doped regions 52 wherein the first channel region includes a heterojunction region that is at most 5 nm thick. In one embodiment, the subthreshold carrier depth associated with the first channel region has a centroid value that lies within the heterojunction region when the gate electrode is mismatched with the channel region. By forming such a structure, the region associated with current flow is effectively confined within the heterojunction region. Thus, a gate electrode having a work function either matched or mismatched with the channel region can be used without substantially changing the depth at which charges flow when the component would be used. Therefore, a transistor with a mismatched gate electrode work function can have a similar off-state leakage current as compared to a transistor with a matched gate electrode work function. Thus, a high performance n-channel transistor or p-channel transistor can be formed with a single metal gate type without the extensive processing normally required to engineer the channel materials.

In a particular embodiment, the electronic device includes a second transistor at the location 26. The second transistor includes a second channel region lying between the doped regions 54, and having a different minority carrier type than the first channel region. In a more particular embodiment, a closest distance between the doped regions 52 is shorter than a closest distance between the doped regions 54. In another particular embodiment, the first transistor includes a first gate electrode, the second transistor includes a second gate electrode, and the first gate electrode and the second gate electrode each include a same material and have a substantially same work function.

In another particular embodiment, the electronic device includes two transistors having a same minority carrier type and different channel lengths. In a more particular embodiment, one channel region includes a heterojunction region and has a shorter length than the other channel region. In another particular embodiment, each of the two transistors includes a gate electrode of a same material and having a substantially same work function as the gate electrode of the other transistor.

In another embodiment, the transistor at the location 24 includes a first channel region having a first subthreshold carrier depth distribution having a first centroid, a first gate electrode, and a first gate dielectric. The transistor at the location 26 includes a second channel having a second subthreshold carrier depth distribution having a second centroid and having the same channel type (e.g., n-channel or p-channel) as the first channel, a second gate electrode with a same work function value as the first gate electrode, and a second gate dielectric. The first centroid is smaller than the second centriod and lies within the semiconductor layer 32. In still another particular embodiment, lower channel doping is used in the transistor with mismatched gate workfunction relative to a transistor with similar Vth and matched gate work function. In such a case, the transistor with the mismatched gate work function can have a higher channel mobility than the transistor with the match gate work function.

Figure 6:
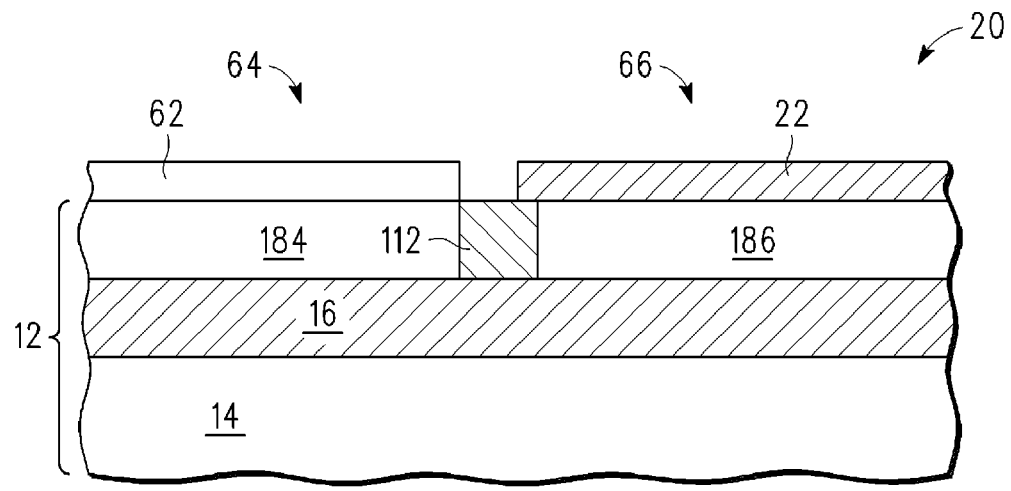
FIG. 6 includes an illustration of a cross-sectional view of the workpiece of FIG. 2 after forming a compound semiconductor layer over an exposed portion of the substrate, according to an alternative embodiment.

FIG. 6 includes an illustration of the workpiece 20 according to an alternative embodiment. Processing proceeds as previously described for FIGS. 1 through 2. After forming the protective layer 22 at a location 66, a compound semiconductor layer 62 is formed over the exposed portion of the semiconductor layer 18 of the semiconductor substrate 12 at a location 64. In one embodiment, the presence of the compound semiconductor layer 62 substantially reduces the likelihood of buried channel effects occurring in the subsequently formed electronic component over the case when the compound semiconductor layer 62 is absent. The compound semiconductor layer 62 can have a substantially same lattice constant as the semiconductor substrate 12 at 0 degrees centigrade. In one embodiment, the compound semiconductor layer 62 includes a III-V or a II-VI semiconductor material. In another embodiment, the compound semiconductor layer 62 has an energy band gap of at least approximately 1.2 eV.

The compound semiconductor layer 62 has a thickness of at least approximately 5 nm and in another embodiment has a thickness of less than approximately 1 micron. In a particular embodiment, the compound semiconductor layer 62 has a thickness in a range of approximate 5 to approximately 100 nm. The compound semiconductor layer 62 can be formed using a conventional or proprietary process. In one embodiment, the compound semiconductor layer 62 is formed by an epitaxial growth process, a CVD process, a PVD process, an ALD process, or any combination thereof.

Figure 7:
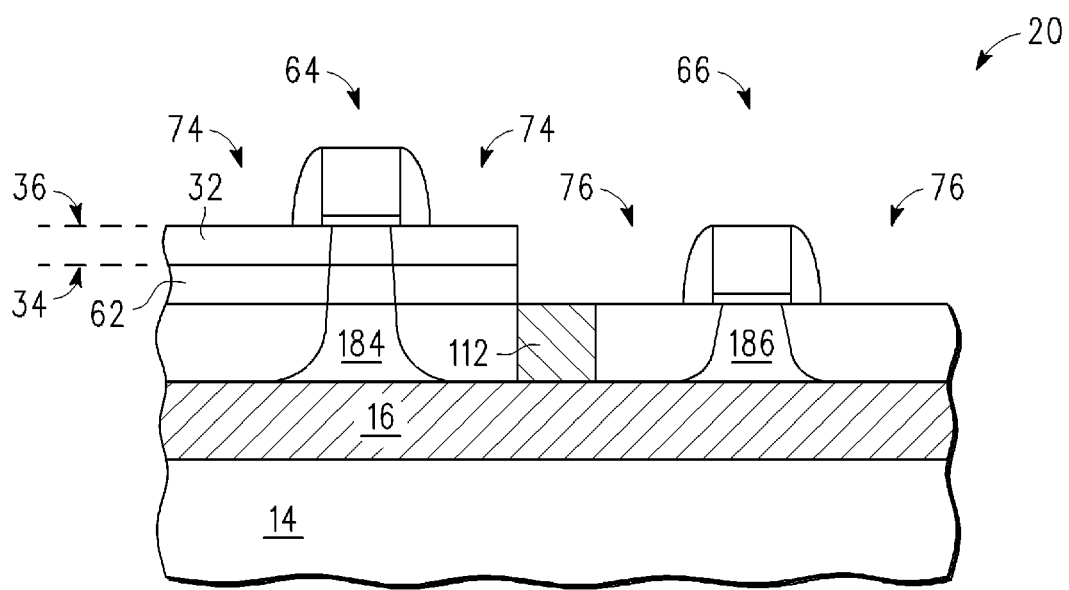
FIG. 7 includes an illustration of a cross-sectional view of the workpiece of FIG. 6 after forming a first transistor at a first location and a second transistor at a second location according to the alternative embodiment.

Processing of the workpiece 20 can proceed as described for the FIGS. 3 through 4 for the workpiece 10. FIG. 7 includes an illustration of the workpiece 20 after forming doped regions 74 and doped region 76. The doped regions 74 serve as source regions, drain regions, or source-drain regions for the electronic component at the location 64, and the doped regions 76 serve as source regions, drain regions, or source-drain regions for the electronic component at the location 66. In the illustrated embodiment, the compound semiconductor layer 62 lies between the semiconductor layer 32 and the semiconductor substrate 12 at the location 64. As previously described with respect to FIG. 3, the semiconductor layer 32 includes a heterojunction region along the first surface 34. The electronic component at location 64 of the workpiece 20 can have advantages as previously described for the electronic component at the location 24 of the workpiece 10, and the electronic component at location 66 of the workpiece 20 can have advantages as previously described for the electronic component at the location 26 of the workpiece 10. In one embodiment, the electronic component at the location 64 can exhibit fewer buried channel effects than the corresponding component at the location 24. One or more insulating layers, one or more interconnect levels, and one or more encapsulating layers are formed using one or more conventional or proprietary techniques to form a substantially complete electronic device according to an alternative embodiment.

Many different aspects and embodiments are possible. Some of those aspects and embodiments are described below. After reading this specification, skilled artisans will appreciate that those aspects and embodiments are only illustrative and do not limit the scope of the present invention. For example, with respect to the alternative embodiment (not illustrated) described with respect to FIGS. 6 and 7 and the workpiece 20, the order of formation of the protective layer 22 and formation of the compound semiconductor layer 62 can be reversed such that the semiconductor layer 18 is exposed at both the location 64 and the location 66 when the compound semiconductor layer 62 is formed. In such a case, the compound semiconductor layer 62 can lie between the electronic component at the location 66 and the active region 186. The doped regions 76 would also lie within the compound semiconductor layer 62 at the location 66. Also in such a case the semiconductor layer 18 and the semiconductor layer 32 can include a same material and a heterojunction region can be formed along the first surface 32 as previously described.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

In a first aspect, an electronic device can include a first transistor including a first channel region. The first channel region includes a heterojunction region overlying a semiconductor substrate, and the heterojunction region is at most approximately 5 nm thick.

In a particular embodiment of the first aspect, the first transistor further includes, a first source/drain region associated with the first channel region, and a second source/drain region associated with the first channel region. The first transistor can also include a first gate electrode associated with the first channel region, and a first gate dielectric layer lying between the first gate electrode and the first channel region. In a more particular embodiment, the first gate electrode includes TaC, TiN, $Mo_2N$, or any combination thereof. In another more particular embodiment, the first gate electrode has a work function mismatched with the first channel region, and a subthreshold carrier depth associated with the first channel region has a centroid value that lies within the heterojunction region.

In still another particular embodiment of the first aspect, the electronic device can further include a second transistor including, a third source/drain region, and a fourth source/drain region. A first closest distance between the first source/drain region and the second source/drain region of the first transistor is shorter than a second closest distance between the third source/drain region and the fourth source/drain region of the second transistor. In another particular embodiment, the electronic device can further include a second transistor including a second gate electrode, wherein the first gate electrode and the second gate electrode include a same material and have substantially a same work function. In yet another particular embodiment, the first gate dielectric layer has a dielectric constant of greater than approximately 8.0.

In another embodiment of the first aspect, the heterojunction region has a thickness of at least approximately 3 nm. In yet another embodiment, the heterojunction region includes a material having a lattice constant different from a lattice constant of the semiconductor substrate at 0 degrees centigrade.

In a particular embodiment of the first aspect, a compound semiconductor layer lies between the heterojunction region and the semiconductor substrate, and a lattice constant of the compound semiconductor layer is substantially the same as the lattice constant of the semiconductor substrate at 0 degrees centigrade. In another particular embodiment, the compound semiconductor layer includes a III-V or a II-VI semiconductor material. In still another particular embodiment, the compound semiconductor layer has an energy band-gap value of at least approximately 1.2 eV. In another embodiment, the electronic device can further include an n-channel transistor, wherein the first transistor includes a p-channel transistor.

In a second aspect, an electronic device can include, an n-channel transistor including, a first channel region having a first subthreshold carrier depth, and a first gate electrode having a first work function matched with the first channel region. The electronic device can also include a p-channel transistor including, a second channel region having a second subthreshold carrier depth, and a second gate electrode having a second work function mismatched with the second channel region. The electronic device can further include a semiconductor layer lying between the second gate electrode and a semiconductor substrate, wherein, the semiconductor layer has a first surface and a second surface opposite the first surface, and the first surface lies closer to the semiconductor substrate than the second surface. A heterojunction region can lie along the first surface of the semiconductor layer, a thickness of the semiconductor layer can have approximately a same value as the first subthreshold carrier depth, and the first subthreshold carrier depth has approximately a same value as the second subthreshold carrier depth.

In one embodiment of the second aspect, the first work function of the first gate electrode and the second work function of the second gate electrode have substantially a same value.

In a third aspect, a process of forming an electronic device can include, forming a first semiconductor layer over a semiconductor substrate, wherein, the semiconductor substrate has a first conductivity type. The first semiconductor layer can have a second conductivity type, and the first semiconductor layer is at most approximately 5 nm in thickness. The first semiconductor layer can have a first surface and a second surface opposite the first surface, wherein the first surface lies closer to the semiconductor substrate than the second surface. A heterojunction region can lie along the first surface of the first semiconductor layer. The process can further include forming a gate structure over the first semiconductor layer, wherein the gate structure is associated with a channel region, and the heterojunction region substantially lies within the channel region.

In one embodiment of the third aspect, forming the first semiconductor layer includes epitaxially growing the first semiconductor layer. In another embodiment, forming the gate structure includes forming a gate dielectric layer using an atomic layer deposition process. In still another embodiment, forming the gate structure includes forming a gate electrode using an atomic layer deposition process, wherein the gate electrode has a work function mismatched with the channel region. In yet another embodiment, the process can further include forming a compound semiconductor layer over the substrate prior to forming the first semiconductor layer, and wherein forming the first semiconductor layer includes forming the first semiconductor layer. The first surface of the first semiconductor layer can lie adjacent to the compound semiconductor layer, and the compound semiconductor layer has an energy band gap greater than approximately 1.2 eV.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising a first transistor, the first transistor comprising:
   a first source/drain region having a first uppermost surface at a first elevation and a first lowermost surface at a second elevation;
   a second source/drain region having a second uppermost surface substantially at the first elevation and a second lowermost surface substantially at the second elevation;
   a first gate electrode; and
   a first channel region, wherein the first channel region includes a heterojunction region overlying a semiconductor substrate, and the heterojunction region is at most approximately 5 nm thick,
   wherein:
   the heterojunction region is a portion of the first channel region lying between the first gate electrode and a heterojunction, the heterojunction being the interface of a first layer underlying the first channel region and a second layer underlying the first channel region, the second layer having a different semiconductor composition than the first layer; and
   the heterojunction lies at a third elevation that is between the first and second elevations.

2. The electronic device of claim 1, wherein the first transistor further comprises:
   a first gate dielectric layer lying between the first gate electrode and the first channel region.

3. The electronic device of claim 1, wherein the first gate electrode comprises TaC, TiN, $Mo_2N$, or any combination thereof.

4. The electronic device of 1, wherein:
   the first gate electrode has a work function mismatched with the first channel region; and
   a subthreshold carrier depth associated with the first channel region has a centroid value that lies within the heterojunction region.

5. The electronic device of claim 1, further comprising a second transistor including:
   a third source/drain region;
   a fourth source/drain region, wherein a first closest distance between the first source/drain region and the second source/drain region of the first transistor is shorter than a second closest distance between the third source/drain region and the fourth source/drain region of the second transistor; and
   a second channel region that does not include a heterojunction region.

6. The electronic device of claim 1, further comprising a second transistor including a second gate electrode, wherein the first gate electrode and the second gate electrode include a same material and have substantially a same work function.

7. The electronic device of claim 1, wherein the first gate dielectric layer has a dielectric constant of greater than approximately 8.0.

8. The electronic device of claim 1, wherein the heterojunction region has a thickness of at least approximately 3 nm.

9. The electronic device of claim 1, wherein the heterojunction region comprises a material having a lattice constant different from a lattice constant of the semiconductor substrate at 0 degrees centigrade.

10. The electronic device of claim 1, wherein:
    a compound semiconductor layer lies between the heterojunction region and the semiconductor substrate; and a lattice constant of the compound semiconductor layer is substantially the same as the lattice constant of the semiconductor substrate at 0 degrees centigrade.

11. The electronic device of claim 10, wherein the compound semiconductor layer comprises a III-V or a II-VI semiconductor material.

12. The electronic device of claim 10, wherein the compound semiconductor layer has an energy band-gap value of at least approximately 1.2 eV.

13. The electronic device of claim 1, further comprising an n-channel transistor, wherein the first transistor includes a p-channel transistor.

14. An electronic device comprising:
an n-channel transistor including:
a first channel region having a first subthreshold carrier depth; and
a first gate electrode having a first work function matched with the first channel region; and
a p-channel transistor including:
a second channel region having a second subthreshold carrier depth;
a second gate electrode having a second work function mismatched with the second channel region; and
a semiconductor layer lying between the second gate electrode and a semiconductor substrate, wherein:
the semiconductor layer has a first surface and a second surface opposite the first surface;
the first surface lies closer to the semiconductor substrate than the second surface;
a heterojunction region lies along the first surface of the semiconductor layer, wherein the heterojunction region is a portion of the second channel region of the p-channel transistor lying between the second gate electrode and a heterojunction, the heterojunction being the interface of semiconductor layer and the semiconductor substrate underlying the first channel region, the semiconductor layer having a different semiconductor composition than the semiconductor substrate a thickness of the semiconductor layer has approximately a same value as the first subthreshold carrier depth; and
the first subthreshold carrier depth has approximately a same value as the second subthreshold carrier depth.

15. The electronic device of claim 14, wherein the first work function of the first gate electrode and the second work function of the second gate electrode have substantially a same value.

16. The electronic device of claim 5, wherein:
each of the first and second source/drain regions lies within a SiGe alloy layer and a silicon layer; and
each of the third and fourth source/drain regions lies within the silicon layer but does not lie within the SiGe alloy layer.

17. The electronic device of claim 1, wherein each of the first and second source/drain regions lie within a first semiconductor layer overlying a second semiconductor layer overlying and a third semiconductor layer, wherein the first, second, and third semiconductor layers have different compositions as compared to one another.

18. The electronic device of claim 17, wherein the first semiconductor layer comprises a SiGe alloy, the second semiconductor layer comprises a silicon layer, and the third semiconductor layer comprises a III-V or a II-VI semiconductor material.

19. The electronic device of claim 1, wherein the first gate dielectric layer has a dielectric constant greater than 8.

20. The electronic device of claim 1, wherein the first gate dielectric layer comprises $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing or any combination thereof.

* * * * *